United States Patent
Tsuchiya et al.

(10) Patent No.: US 6,478,834 B2
(45) Date of Patent: Nov. 12, 2002

(54) SLURRY FOR CHEMICAL MECHANICAL POLISHING

(75) Inventors: Yasuaki Tsuchiya, Tokyo (JP); Tomoko Wake, Tokyo (JP); Tetsuyuki Itakura, Tokyo (JP); Shin Sakurai, Tokyo (JP); Kenichi Aoyagi, Tokyo (JP)

(73) Assignees: NEC Corp. (JP); Tokyo Magnetic Printing Co. Ltd (JP)

(*) Notice: Subject to any disclaimer, the term of this patent is extended or adjusted under 35 U.S.C. 154(b) by 0 days.

(21) Appl. No.: 09/989,016

(22) Filed: Nov. 20, 2001

(65) Prior Publication Data

US 2002/0104268 A1 Aug. 8, 2002

(30) Foreign Application Priority Data

Nov. 24, 2000 (JP) ......................................... 2000-357797

(51) Int. Cl.$^7$ ............................. C09K 3/14; C09K 1/02; C09K 1/04
(52) U.S. Cl. ............................. 51/307; 51/308; 51/309; 106/3; 438/692; 438/693
(58) Field of Search .......................... 51/307, 308, 309; 106/3; 438/692, 693; 510/175, 395, 397

(56) References Cited

U.S. PATENT DOCUMENTS 6,063,306 A * 5/2000 Kaufman et al. ............. 51/309

FOREIGN PATENT DOCUMENTS

| JP | 8-83780 | 3/1996 |
| JP | 10-44047 | 2/1998 |
| JP | 10-46140 | 2/1998 |
| JP | 10-163141 | 6/1998 |
| JP | 11-21546 | 1/1999 |
| JP | 11-204474 | 7/1999 |
| JP | 11-238709 | 8/1999 |
| JP | 11-302633 | 11/1999 |
| JP | 2000-501771 | 2/2000 |

* cited by examiner

Primary Examiner—Michael Marcheschi
(74) Attorney, Agent, or Firm—Dickstein, Shapiro, Morin & Oshinsky, LLP.

(57) ABSTRACT

By using a polishing slurry which comprises, at least, a polishing grain, an oxidizing agent and a higher-mono-primary amine, it is possible to suppress dishing and erosion liable to be produced in chemical mechanical polishing (CMP) for a copper-based metal film when forming a buried interconnection of a copper-based metal on a barrier metal film of a tantalum-based metal.

17 Claims, 3 Drawing Sheets

(a)

(b)

(c)

Isolated interconnect    Dense interconnect (d)

(a)

(b) Isolated interconnect   Dense interconnect

SLURRY FOR CHEMICAL MECHANICAL POLISHING

BACKGROUND OF THE INVENTION

The present invention relates to a slurry for chemical mechanical polishing used in fabrication of a semiconductor device, and more particularly to a slurry for chemical mechanical polishing well suited to use in formation of a buried metal interconnection wherein a tantalum-based metal is utilized as a material for a barrier metal film.

In the formation of a semiconductor integrated circuit such as an ULSI (Ultra Large Scale Integrated circuit) for which progress to attain further miniaturization and more densely spaced arrangement has been, in recent years, gathering more speed, copper has been attracting strong attention as a particularly useful material for the electric connection due to its excellent electromagnetic resistance and considerably low electrical resistance.

A copper interconnection is currently formed, due to problems such as a difficulty to make patterning through dry etching, in the following way. That is, after a sunken section such as a trench or a connection hole is formed in an insulating film and a barrier metal film is formed thereon, a copper film is grown by the plating method so as to fill up the sunken section, and then by conducting the chemical mechanical polishing (referred to as "CMP" hereinafter) until the surface of the insulating film other than the sunken section is completely exposed, the surface is planarized, and thereby formation of electric connection sections such as a,buried copper interconnection which is substantially made of copper. filling the sunken section, a via plug, a contact plug and the like are accomplished.

Now, with a reference to FIG. 1, a method of forming a buried copper interconnection is described below.

Firstly, on a silicon substrate where a semiconductor device is formed (not shown in the drawing), there is formed a lower interconnection layer 1 made of an insulating film having a lower interconnection (not shown in the drawing). Thereon, a silicon nitride film 2 and a silicon oxide film 3 are formed consecutively in this order, as shown in FIG. 1(a), and then in the silicon oxide film 3 a sunken section in the form of an interconnection pattern is formed to reach the silicon nitride film 2.

Next, as shown in FIG. 1(b), a barrier metal film 4 is formed by the sputtering method. On the film, a copper film 5 is applied to the entire surface by the plating method so as to fill up the sunken section.

After that, as shown in FIG. 1(c), the copper film 5 is polished by means of CMP to planarize the substrate, surface. Polishing by the CMP continues until the metal over the silicon oxide film 3 is completely removed, as shown in FIG. 1(d).

In such a formation of a buried copper interconnection as described above, a barrier metal film is formed as a base film, for the purpose of preventing diffusion of copper into the insulating film and the like. However, when a tantalum-based metal such as Ta or TaN is employed as a barrier metal film, there may arise a problem that with a conventional polishing slurry the polishing rate for the barrier metal film made of Ta or TaN becomes smaller than that for the copper film, owing to the substantially high chemical stability of Ta and TaN. Specifically, when the formation of a buried copper interconnection or such is carried out using the CMP with a conventional polishing slurry, a considerable difference between rates for the copper film and the barrier metal film are produced, which may bring about dishing and erosion.

Dishing is a phenomenon that copper in the sunken section is excessively polished so that the center of the copper film in the sunken section falls back with respect to the plane of the insulating film laid on the substrate, as shown in FIG. 2. A conventional polishing slurry requires an ample polishing time to remove the barrier metal film 4 lying on the insulating film (silicon oxide film 3) thoroughly because of the considerably low polishing rate for the barrier metal film. The polishing rate for the copper film 5 is, however, higher than that for the barrier metal film 4, so that the copper film 5 becomes excessively polished to create dishing.

Erosion is, on the other hand, a phenomenon that polishing in a densely-spaced interconnection region proceeds excessively, compared with that in a region with a low interconnection density such as an isolated interconnection region, so that the surface of the densely-spaced interconnection region falls back with respect to the surface of other regions, as shown in FIG. 1(d). When, in a wafer, the densely-spaced interconnection region where many buried sections formed of the copper film 5 are present is considerably separated from the isolated interconnection region where a few buried section formed of the copper film 5 are present by, for example, a region without any interconnections, and the copper film 5 is polished faster than the barrier metal film 4 or a silicon oxide film 3 (an insulating film), then, in the densely-spaced interconnection region, a polishing pad pressure to the barrier metal film 4 or the silicon oxide film 3 becomes higher than that in the isolated interconnection region. As a result, in the CMP step after exposing the barrier metal film 4 (the step of FIG. 1(c) and thereafter), there is produced a difference in polishing rate by the CMP between the densely-spaced interconnection region and the isolated interconnection region so that the insulating film in the densely-spaced interconnection region is excessively polished to create erosion.

Dishing created in the step of forming an electric connection section in a semiconductor device as described. above may cause an increase in interconnection resistance and connection resistance as well as an increase in electron migration liability, which may lower the reliability of the device. The creation of erosion may also adversely affect the evenness of the substrate surface, the effect of which becomes more prominent in a multi-layered structure so that problems such as an increase and a variation in interconnection resistance may arise.

So far, various investigations have been made to overcome these problems.

For example, in JP-A 83780/1996, it is disclosed that dishing in the CMP step may be prevented by using a polishing slurry which contains benzotriazole or its derivative and thereby forming a protective film on a copper surface.

Further, in JP-A 238709/1999, there is a similar description of a prevention effect that triazole compounds have on dishing.

Further, in JP-A 163141/1998, there is disclosed a polishing composition for a copper film, which comprises a polishing material and water, further containing an iron (III) compound dissolved in the composition. In Examples therein, it is further described that, using colloidal silica as the polishing material and iron (III) citrate, ammonium iron (III) citrate or ammonium iron (III) oxalate as an iron (III) compound, the polishing composition can increase the polishing rate for a copper film and prevent surface defects such as dishing and scratches from occurring.

However, these publications describe nothing concerning polishing of the barrier metal film made of a tantalum-based metal or erosion.

Meanwhile, with the object of improving efficiency of the polishing slurry, addition of amine compounds has been the subject of investigation.

For example, in Examples of JP-A 44047/1998, it is described that, when CMP is carried out using a polishing slurry that contains an alumina polishing material, ammonium persulfate (an oxidizing agent) and a specific carboxylic acid, a difference in polishing rate between an aluminium layer for interconnection and a silicon oxide film becomes widened and, at the same time, a removal rate of a titanium film that serves as a barrier metal film becomes heightened.

Further, in JP-A 46140/1998, there is disclosed a composition for chemical mechanical polishing which contains a specific carboxylic acid, an oxidizing agent and water, whose pH is adjusted to 5–9 using ammonia as an alkali.

Further, in JP-A 21546/1999, there is disclosed a slurry for chemical mechanical polishing which contains urea, a metal oxide polishing material and ammonium oxalate. In Examples therein, there is further described an example wherein Cu, Ta and PTEOS were polished using a slurry with a pH value of 7.5, which was prepared using alumina as the polishing material, hydrogen peroxide as an oxidizing agent, benzotriazole as a film-forming agent and tartaric acid or ammonium oxalate as a complex-forming agent.

In addition, in JP-A 501771/2000, there is described an addition of a hydroxylamine compound or a hydroxylamine salt as a selective redox compound. Therein, an addition of an ammonium peroxy compound is also described.

Further, in JP-A 302633/1999, an addition of a water-soluble amine into a polishing slurry is described. Examples of a water-soluble amine mentioned therein include alkanolamines such as diethanolamine, triethanolamine, 2-aminoethanol, and aminoethylethanolamine; polyamines such as diethylenetriamine, triethylenetetramine, tetraethylenepentamine, pentaethylenehexamine, and triethylenediamine; and imines such as polyethyleneimine.

As set forth above, these publications disclose the use of amine-based compounds. Nevertheless, none of them describe a use of a higher-mono-primary amine with a characteristic structure as an amine-based compound. Moreover, even if any polishing slurry disclosed in those publications is utilized, dishing and erosion in a buried copper interconnection cannot necessarily suppressed satisfactorily.

Further, in JP-A 204474/1999, an addition of an organic amine into a polishing slurry is described. Examples of an organic amine mentioned therein include lower-mono-primary amines such as methylamine, ethylamine and isopropylamine; secondary amines such as dimethylamine, diethylamine and diisopropylamine; tertiary amines such as trimethylamine, triethylamine and triisopropylamine; and aromatic amines such as aniline. Nevertheless, a matter of the primary concern in that publication is polishing of a fluorine-containing film so that an organic amine is utilized merely as a substitute for potassium hydroxide, and a particular use of a mono-primary amine with a higher substituent as an organic amine is not reported. Neither is suggested that the use of a higher-mono-primary amine can reduce the polishing rate of the tantalum-based barrier metal film and, therefore, suppress the occurrence of dishing and erosion in the buried copper interconnection section satisfactorily.

As described above, although a number of proposals for adding an amine-based compound have been made, no polishing slurry with a higher-mono-primary amine is reported. Because of this, the polishing rate for a tantalum-based barrier metal film is, in some cases, reduced and, consequently, the occurrence of neither dishing nor erosion in the buried copper interconnection section is satisfactorily suppressed.

SUMMARY OF THE INVENTION

Accordingly, an object of the present invention is to provide a slurry for chemical mechanical polishing, which can suppress the occurrence of dishing and erosion in the CMP and form a buried interconnection with a little variation in interconnection resistance when forming a buried copper interconnection in which a tantalum-based metal is utilized as a barrier metal film.

The present invention relates to a slurry for chemical mechanical polishing to polish a copper-based metal film formed on a tantalum-based metal film, which comprises a polishing grain, an oxidizing agent and a higher-mono-primary amine.

In the present invention, a copper-based metal refers to copper or an alloy the main component of which is copper, and a tantalum-based metal, tantalum (Ta) or tantalum nitride (TaN).

The polishing slurry of the present invention can reduce the polishing rate for a tantalum-based metal film and, thus, increase the difference of the polishing rates between the tantalum-based metal film and a copper-based metal film so that the function of the tantalum-based metal film as a stopper film (polishing stopper) in polishing of a copper-based metal film is enhanced. As a result, in formation of a buried interconnection of a copper-based metal with a barrier metal film made of a tantalum-based metal, dishing and erosion which may result from CMP can be prevented from occurring and a buried interconnection of a copper-based metal wherein a variation in interconnection resistance is well suppressed can be formed.

DETAILED DESCRIPTION

Now, preferred embodiments of the present invention are described below.

In the present invention, a higher-mono-primary amine is added as an amine-based compound into a polishing slurry. When the CMP is carried out using such a polishing slurry, the polishing rate of the tantalum-based metal film, in particular, shows a decrease.

Figure 1:
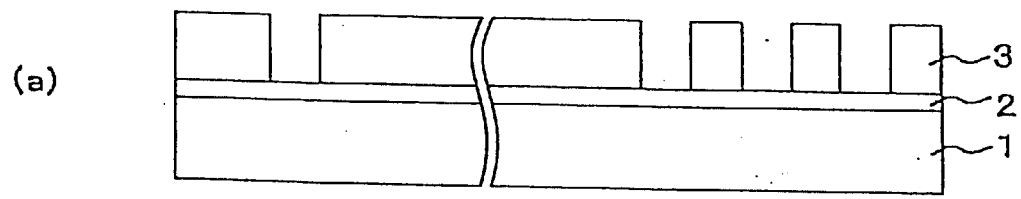
FIGS. 1(a) and 1(d) are a series of schematic cross-sectional views illustrating the steps of a conventional method of forming a buried copper interconnection.
Figure 1:
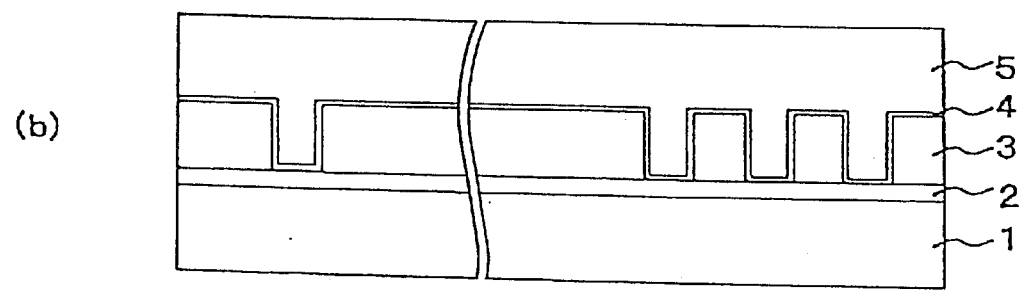
Figure 1:
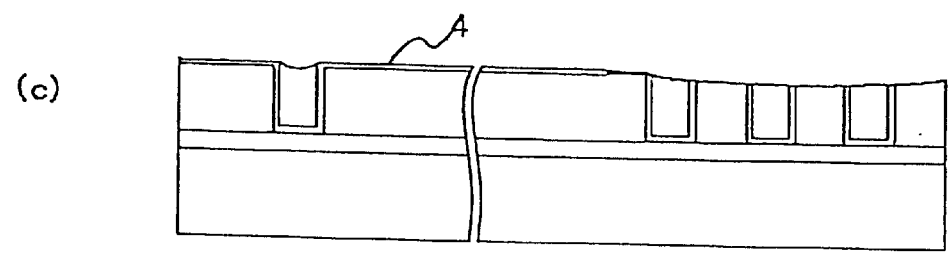
Figure 1:
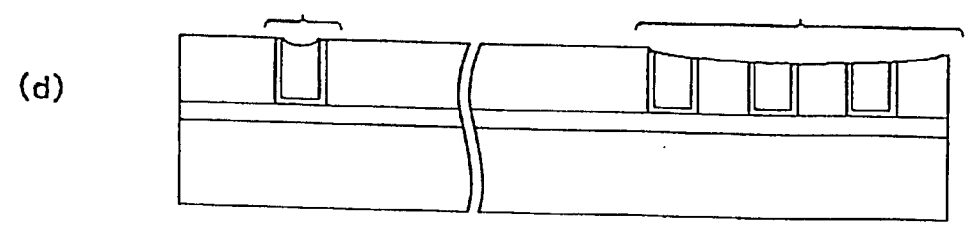
Figure 2:
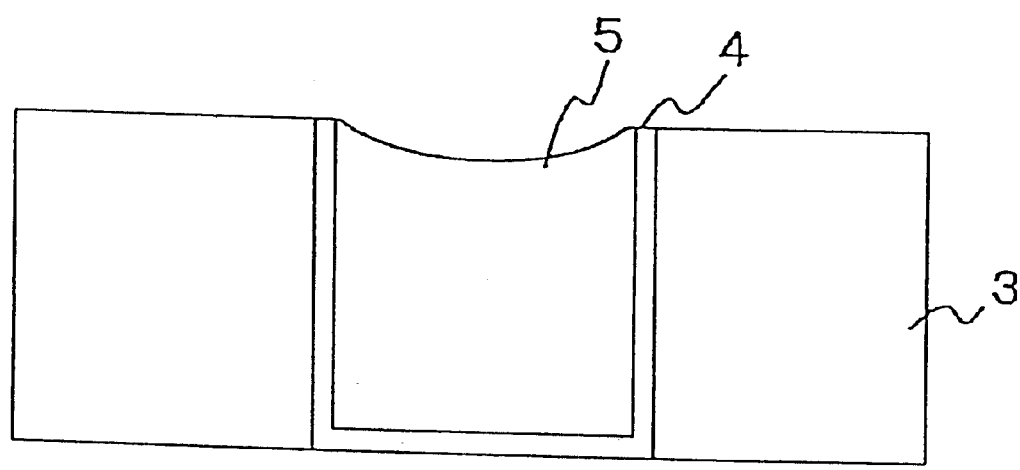
FIG. 2 is a view showing schematically the shape of a cross section of an interconnection section when forming a copper interconnection using a conventional slurry for chemical mechanical polishing.
Figure 3:
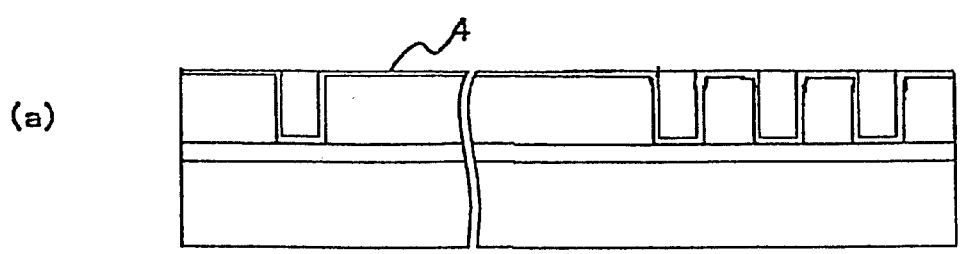
FIGS. 3(a) to 3(b) are a pair of schematic cross-sectional views illustrating the steps of a method of forming a buried copper interconnection using a slurry for chemical mechanical polishing according to the present invention.
Figure 3:
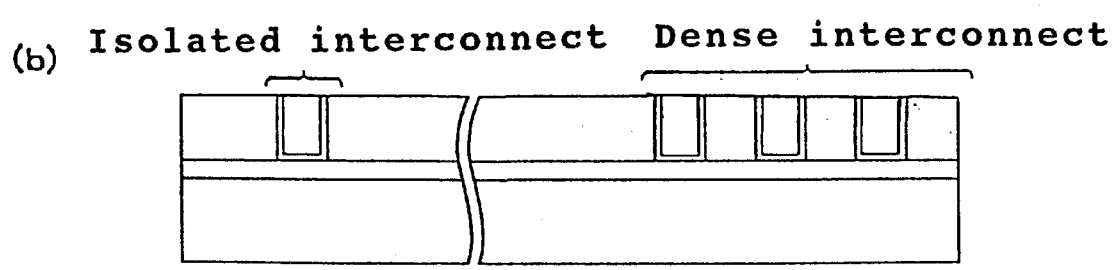

In short, when, with a polishing slurry of the present invention, the CMP is applied to the surface of a substrate, wherein a barrier metal film 4 is formed on an insulating film 3 in which a sunken section is formed, and a copper metal film 5 is formed over the entire surface so as to fill up the sunken section, as shown in FIG. 1(b), a barrier metal film 4 made of a tantalum-based metal may act, in substance, as a stopper film in polishing of a copper-based metal film, as shown in FIG. 3(a), so that dishing and erosion can be prevented from occurring.

After the CMP is blocked with the barrier metal film 4 made of a tantalum-based metal, the CMP may be subsequently carried out after switching the polishing slurry to another polishing slurry with a relatively high polishing rate for a tantalum-based metal film, whereby the formation of a buried interconnection of a copper-based metal wherein dishing and erosion are well suppressed, as shown in FIG. 3(b), can be accomplished.

In the present invention, as an amine-based compound, a higher-mono-primary amine is utilized. In short, a molecule of an amine-based compound has one amino group, and therein two hydrogen atoms and one higher substituent are linked to a nitrogen atom. A higher substituent as used herein means a substituent having a molecular weight high enough to allow its amine-based compound to form a hydrophobic interaction. By using such a high-mono-primary amine, a highly efficient polishing slurry can be readily fabricated.

The reason for this has not been fully elucidated yet, but presumably, is considered as described below.

Firstly, because the polarity of the higher substituent joining to a nitrogen atom is small, the rest of the higher-mono-primary amine may interact with a tantalum-based metal. Consequently, a hydrophobic film made of higher-mono-primary amine may be formed on the surface of the tantalum-based metal, reducing the polishing rate for the tantalum-based metal film.

Meanwhile, the number of carbons contained in a substituent can be used as a standard to judge the molecular weight of the higher substituent. To attain a sufficient hydrophobic interaction, the number of carbons therein is preferably 4 or more. Compared with the case the number of carbons is 3 or less, when the number of carbons is at least 4, a reduction in polishing rate for the tantalum-based metal film is significantly large. On the other hand, to maintain a good solubility for the higher-mono-primary amine, the number of carbons is preferably 10 or less and more preferably 8 or less.

Moreover, if the number of carbons is at least 4, volatilization of higher-mono-primary amine from the polishing slurry may be advantageously suppressed.

Secondly, the primary amine has better solubility than the secondary amine and the tertiary amine. Therefore, even when linked to a higher substituent, the primary amine can maintain sufficient solubility, which provides a considerably high degree of freedom for the amount of addition to the higher-mono-primary amine. Further, as the primary amine interacts strongly with a tantalum-based metal film, the polishing rate for the tantalum-based film can be well reduced.

Thirdly, because the mono-amine has only one amino group in a molecule, when the amino group interacts with a tantalum-based metal film, a stable hydrophobic film is formed on the surface of the tantalum-based metal film. Because of this, the polishing rate for the tantalum-based metal film reduces markedly.

As an example of a higher-mono-primary amine with characteristics described above, there can be given alkylamine having the following general formula (1).

$$C_xH_{2x+1}-NH_2 \qquad (1).$$

Herein to provide a sufficient hydrophobic nature to the substituent, x is preferably a natural number that is not less than 4, while, to provide a good solubility to the higher-mono-primary amine, x is preferably a natural number that is not greater than 10 and more preferably a natural number that is not greater than 8.

Further, examples of a higher-mono-primary amine having the general formula (1) include n-butylamine, s-butylamine, t-butylamine, n-pentylamine (sometimes referred to as n-amylamine), isopentylamine, neopentylamine, t-pentylamine, 1-methylbutylamine, and n-hexylamine.

Meanwhile, as an example of another higher-mono-primary amine, there can be give alkoxyalkylamine having the general formula (2).

$$C_mH_{2m+1}-O-C_nH_{2n}-NH_2 \qquad (2)$$

Herein, m and n are independently natural numbers equal to or less than 6, and, in order to provide a sufficient hydrophobic nature to the substituent, a sum of m and n is preferably a natural number that is not less than 4, while, in order to provide a good solubility to the higher-mono-primary amine, the sum of m and n is preferably a natural number that is not greater than 10 and more preferably a natural number that is not greater than 8.

Further, examples of a higher-mono-primary amine having the general formula (2) include isopropoxy-n-propylamine:

$$(CH_3)_2CHO(CH_2)_3NH_2 \qquad (3)$$

and n-butoxy-n-propylamine:

$$CH_3(CH_2)_3O(CH_2)_3NH_2 \qquad (4).$$

The afore-mentioned higher-mono-primary amines can be each used independently. Alternatively, mixtures of two or more types can be used and, in this instance, it is particularly preferable to employ at least one type selected from the group consisting of butylamine, pentylamine, hexylamine, propoxyethylamine, propoxypropylamine and butoxypropylamine.

Among these, amylamine is preferable due to its high solubility in aqueous solvent and large reducing effect on the polishing rate for the tantalum-based metal film.

The higher-mono-primary amines described above are considered to interact strongly with a tantalum-based metal film. In consequence, these higher-mono-primary amines are believed to enhance the lubricity of the polished surface by entering between the polished surface of the tantalum-based metal film and the polishing grain. Therefore, the use of the slurry of the present invention is thought to increase slipperiness of the polishing grain on the polished surface, and lower the mechanical polishing effect the polishing grain has.

Now, since a tantalum-based metal is chemically stable by nature, the effect of mechanical polishing is predominant in the CMP for a tantalum-based metal film, and the contribution of chemical polishing is small. Thus, the polishing slurry containing a higher-mono-primary amine according to the present invention may suppress mechanical polishing for the tantalum-based metal film, and, in effect, the CMP rate for the tantalum-based metal film may be reduced. In contrast with this, in the CMP for a copper-based metal film, the contribution of chemical polishing is large enough not to allow the excessive reduction in polishing rate for the copper-based metal film.

As a result, a polishing slurry of the present invention may reduce the polishing rate for the tantalum-based metal film while increasing the difference in polishing rate between the tantalum-based metal film and the copper-based metal film. Therefore, in polishing of the copper-based metal film, the function as a stopper film which the barrier metal film made of the tantalum-based metal has (a polishing stopper) may be enhanced.

Viewed from the point of minimizing polishing of the tantalum-based metal film, a content of the higher-mono-primary amine is preferably not less than 0.01 wt % and more preferably not less than 0.1 wt % to the whole amount of the polishing slurry. On the other hand, for the purpose of preventing the pH of the polishing slurry to become excessively high, the content is preferably not greater than 5 wt % and more preferably not greater than 1 wt %.

Examples of a polishing material that may be contained in a polishing slurry of the present invention include alumina-based polishing materials such as α-alumina, θ-alumina, γ-alumina and fumed alumina; silica polishing materials such as fumed silica and colloidal silica; metal-based polishing grains such as titania, zirconia, germania and ceria; and metal-based polishing grains made of these metal oxides. Among these, alumina-based polishing materials and silica polishing materials are preferable.

A content of the polishing grain contained in the polishing slurry of the present invention is preferably not less than 1 wt % and more preferably not less than 3 wt %; but preferably not greater than 30 wt % and more preferably not greater than 10 wt % to the total amount of the slurry for chemical mechanical polishing. When the polishing slurry contains two or more types of polishing grains, the sum of the contents of the respective polishing grains is preferably not less than 1 wt % and more preferably not less than 3 wt %; but preferably not greater than 30 wt % and more preferably not greater than 10 wt %.

An oxidizing agent contained in the polishing slurry of the present invention may be selected from known water-soluble oxidizing agents, taking a polishing accuracy and a polishing efficiency into consideration. For example, those which may cause little heavy-metal ion contamination include peroxides such as $H_2O_2$, $Na_2O_2$, $Ba_2O_2$ and $(C_6H_5C)_2O_2$; hypochlorous acid (HClO); perchloric acid; nitric acid; ozone water; and organic acid peroxides such as peracetic acid and nitrobenzene. Among these, hydrogen peroxide ($H_2O_2$) is preferable because it does not contain a metal component or does not generate a harmful byproduct.

An added amount of the oxidizing agent is preferably not less than 0.01 wt % and more preferably not less than 0.1 wt % to the total amount of the polishing slurry to achieve adequate effects of its addition; but preferably not greater than 15 wt % and more preferably not greater than 10 wt % to suppress dishing and adjust a polishing rate to an appropriate value. When using an oxidizing agent which is relatively susceptible to deterioration with age such as hydrogen peroxide, it may be possible to prepare separately a solution containing an oxidizing agent at a given concentration and a composition which is to provide a prescribed polishing slurry on addition of the solution containing that oxidizing agent, and then to combine together just before use.

In order to enhance oxidation brought about by an oxidizing agent and to carry out polishing stably, an organic acid such as carboxylic acid or amino acid is generally added, as a proton donor, into the polishing slurry used in the CMP.

Examples of a carboxylic acid include oxalic acid, malonic acid, tartaric acid, malic acid, glutaric acid, citric acid, maleic acid, formic acid, acetic acid, propionic acid, butyric acid, valeric acid, acrylic acid, lactic acid, succinic acid, nicotinic acid, their salts and a mixture of these carboxylic acids.

An amino acid may be added as a free form or added as a salt or a hydrate. Examples thereof include arginine, arginine hydrochloride, arginine picrate, arginine flavianate, lysine, lysine hydrochloride, lysine dihydrochloride, lysine picrate, histidine, histidine hydrochloride, histidine dihydrochloride, glutamic acid, glutamic acid hydrochloride, sodium glutaminate monohydrate, glutamine, glutathione, glycylglycine, alanine, β-alanine, γ-aminobutyric acid, ε-aminocarproic acid, aspartic acid, aspartic acid monohydrate, potassium aspartate, potassium aspartate trihydrate, tryptophan, threonine, glycine, cystine, cysteine, cysteine hydrochloride monohydrate, oxyproline, isoleucine, leucine, methionine, ornithine hydrochloride, phenylalanine, phenylglycine, proline, serine, tyrosine, valine and a mixture of these amino acids.

In order to achieve adequate effects of its addition as a proton donor, a content of the afore-mentioned organic acid is preferably not less than 0.01 wt % and more preferably not less than 0.05 wt % to the total amount of the polishing slurry. On the other hand, to protect the polishing retardation effect a higher-mono-primary amine brings about for the tantalum-based film, the content thereof is preferably not greater than 5 wt % and more preferably not greater than 3 wt %. When the polishing slurry contains a plurality of organic acids, the above content is defined as the sum of the contents of the respective organic acids.

To provide sufficient interaction between the higher-mono-primary amine and the tantalum-based metal film, a pH value of the polishing slurry of the present invention is preferably not less than 3 and more preferably not less than 4, but preferably not greater than 9 and more preferably not greater than 8.

For the polishing slurry, the pH may be adjusted, for example, by adding an acid or an alkali directly to the polishing slurry. As an acid for the pH regulation, nitric acid, phosphoric acid, sulfuric acid or such can be used. Examples of an alkali for the pH regulation which may be employed include alkali metal hydroxides such as sodium hydroxide and potassium hydroxide; alkali metal carbonates such as sodium carbonate and potassium carbonate; and ammonia.

Further, it is preferable that the polishing slurry of the present invention further comprises an antioxidant. An addition of an antioxidant may facilitate the adjustment of the polishing rate for a copper-based metal film and, through the formation of a coating film over the surface of the copper-based metal film, the suppression of dishing. Therefore, when the polishing slurry contains both a higher-mono-primary amine and an antioxidant, both erosion and dishing become suppressed more effectively. Moreover, an addition of a higher-mono-primary amine as well as an antioxidant to the polishing slurry makes independent adjustments of the polishing rates for the tantalum-based metal film and the copper-based metal film possible and, consequently, a ratio of polishing rates of the copper-based metal film/the tantalum-based metal film becomes controllable within a wider range.

Examples of an antioxidant include benzotriazole, 1,2,4-triazole, benzofuroxan, 2,1,3-benzothiazole, o-phenylenediamine, m-phenylenediamine, cathechol, o-aminophenol, 2-mercaptobenzothiazole, 2-mercaptobenzimidazole, 2-mercaptobenzoxazole, melamine, and their derivatives.

Among these, benzotriazole and benzotriazole derivatives, 1,2,4-triazole and 1,2,4-triazole derivatives are preferable. As an example of a benzotriazole derivative, there can be given a substituted benzotriazole, one of the hydrogen atoms in a benzen ring being replaced by hydroxy group; alkoxy group such as metoxy and ethoxy; amino group; nitro group; alkyl group such as methyl group, ethyl group and butyl; or halogen substituent group such as fluorine, chlorine, bromine and iodine. Further, as an example of a 1,2,4-triazole derivative, there can be given a substituted 1,2,4-triazole with a five-membered ring having one of the above substituent groups.

A content of the antioxidant of this sort is preferably not less than 0.0001 wt % and more preferably not less than 0.001 wt % to the total amount of the polishing slurry to achieve adequate effects of its addition. On the other hand, to adjust the polishing rate to an appropriate value, the content is preferably not greater than 5 wt % and more preferably not greater than 2.5 wt %.

A polishing slurry of the present invention can contain a variety of additives such buffer agents and viscosity modifiers which are in wide use as common additives to the polishing slurry as long as it does not affect adversely the properties of the slurry.

In a polishing slurry of the present invention, a composition may be adjusted to make the polishing rate for a tantalum-based metal film preferably not greater than 10 nm/min and more preferably not greater than 3 nm/min. Further, a composition may be adjusted to make the polishing rate for a copper-based metal film not less than 300 nm/min and more preferably not less than 400 nm/min, but preferably not greater than 1500 nm/min and more preferably not greater than 1000 nm/min.

Further, a ratio of the polishing rates of the copper-based metal film to that of the tantalum-based metal film (Cu/Ta polishing ratio) is preferably not less than 50/1 and more preferably not less than 100/1, viewed from the point of achieving uniform CMP of the copper-based metal film, irrespective of an interconnection pattern made of the copper-based metal within a wafer surface.

For a method of preparing a polishing slurry of the present invention, an ordinary method of preparing an aqueous polishing slurry composition with a free grain can be applied. Specifically, a polishing grain with an appropriate amount is added to an aqueous medium to, and then, if necessary, a dispersing agent with an appropriate amount may be also added. The polishing grain herein is present in aggregated state. Therefore, the polishing grain is dispersed so that the aggregated polishing particle may be made into particles with a prescribed particle size. The step of dispersion may be carried out using, for example, an ultrasonic disperser, a bead mill disperser, a kneader disperser or a ball mill disperser.

A polishing slurry of the present invention may be most effectively used for forming an electric connection section such as a buried interconnection, a via plug and a contact plug by performing the CMP of a substrate wherein a tantalum-based metal film as a barrier metal film is formed on an insulating film having a sunken section and, thereon, a copper-based metal film is formed over the entire surface so as to fill up the sunken section. Examples of an insulating film include a silicon oxide film, a BPSG (Boro-Phospho Silicate Glass) film and a SOG (Spin On Glass) film. As a copper alloy, there can be taken an alloy that is mainly composed of copper but also containing a metal such as silver, gold, platinum, titanium, tungsten or aluminium.

The CMP using a polishing slurry of the present invention may be, for example; conducted with an ordinary CMP apparatus, as follows. A wafer on which a copper-based metal film is grown is placed on a spindle wafer carrier. The surface of this wafer is set to contact with a polishing pad made of porous urethane which is adhered onto a rotary plate (surface plate). While supplying a polishing slurry to the surface of the polishing pad from a polishing slurry inlet, both the wafer and the polishing pad are rotated to polish the wafer. If necessary, a pad conditioner is made to contact with the surface of the polishing pad to condition the surface of the polishing pad.

The removal of the copper-based metal film to expose the tantalum-based metal film may be detected by a variety of methods.

As first example of such a method, there can be given a method wherein the polishing rate for that copper-based metal film is measured in advance, and a time required to remove the copper-based metal film with a prescribed thickness is determined by calculation, and thereby a CMP of the copper-based metal film is performed to terminate when a certain given time passes after that estimated time period from the starting time thereof elapses.

As second example, there can be given a method wherein, since a tantalum-based metal film acts as a stopper film when using a polishing slurry of the present invention, CMP is conducted while monitoring the polishing rate and the CMP is terminated when a certain given time passes after the time the polishing rate starts falling rapidly.

In the third example, CMP is conducted while measuring changes in rotation torque to a rotation axis with a rotation torque meter being set on the rotation axis of the rotary plate. The CMP of a copper-based metal film is, therein, terminated when a certain given time passes after detecting a change in rotation torque that occurs along with exposure of the tantalum-based metal film, the copper-based metal film being removed. That is, although the rotation torque is substantially constant while the copper-based metal film is polished, the rotation torque decreases once the tantalum-based metal film is exposed. Accordingly, CMP is terminated when a certain given time passes after the rotation torque starts decreasing.

In the fourth example, light is irradiated to a polished surface of a substrate and CMP is applied thereto while measuring the reflected light. In effect, as CMP proceeds from a copper-based metal film to a tantalum-based metal film, the metal exposed in the polished surface is replaced with the other one so that the intensity of the reflected light significantly changes. Accordingly, the CMP is terminated when a certain given time passes after the intensity of the reflected light starts changing.

In CMP of a copper-based metal film formed on a tantalum-based metal film, the use of a polishing slurry of the present invention significantly improves the function of the tantalum-based metal film as a stopper film. In consequence, further proceeding of the CMP may be advantageously suppressed once the tantalum-based metal film is exposed, even when polishing is excessively operated. Therefore, dishing and erosion may be well prevented from occurring so that excellent planarization of the substrate surface may be attained, which suppresses an increase and a variation in interconnection resistance.

After completion of the CMP for the copper-based metal film, CMP for the tantalum-based metal film is carried out replacing the polishing slurry with a slurry exhibiting a relatively low polishing rate for the copper-based metal film. For such a slurry, a polishing slurry without containing any higher-mono-primary amine may be employed.

With reference to Examples, the present invention is described in detail below.

CMP Test

A substrate on which layers of a tantalum film and a copper film were laid was fabricated as follows. On a 6 inch wafer (silicon substrate, not shown in the drawing) in which a semiconductor device such as a transistor was formed, a lower interconnection layer 1 made of a silicon oxide film which comprised a lower interconnection (not shown in the drawing) was formed. As shown in FIG. 1(a), a silicon nitride film 2 was then formed on the lower interconnection layer, and thereon a silicon oxide film 3 with a thickness of 500 nm or so was formed. The silicon oxide film 3 was patterned by means of normal photolithography and reactive ion etching to form a trench for interconnection and a connection hole, with a width of 0.23 to 10 μm and a depth of 500 nm. Then, as shown in FIG. 1(b), a Ta film 3 was formed to a thickness of 50 nm by the sputtering method, and consecutively a Cu film was formed to a thickness of 50 nm or so by the sputtering method, and thereafter a copper film 5 was formed to a thickness of 800 nm or so by the sputtering method.

CMP was carried out using a Speedfam-Ipec Type SH-24 apparatus. The polisher was used, on a surface plate of which a polishing pad (Rodel-Nitta IC 1400) was attached. Polishing conditions were as follows; a polishing load (a contact pressure of the polishing pad): 27.6 kPa, a rotating speed of the surface plate: 55 rpm; a carrier rotating speed: 55 rpm; and a polishing slurry feeding rate: 100 ml/min.

Polishing rates for the tantalum film and the copper film were measured as follows. Four needle electrodes were aligned on the wafer with a given interval. With a given current being applied between the outer two probes, a potential difference between two inner probes was measured to determine a resistance (R'), and further a surface resistivity (ρs') was obtained by multiplying that value by a correction factor RFC (Resistivity Correction Factor). A surface resistivity (ρs') for another wafer film with a known thickness (T) (nm) was also obtained. The surface resistivity is inversely proportional to the thickness. Thus, when a thickness for a wafer with a surface resistivity of ρs' is d, an equation d (nm)=(ρs×T)/ρs' is given. Using this equation, the thickness d can be determined. The polishing rate was then estimated by dividing the difference between film thicknesses before and after polishing by the polishing time. In the measurements of the surface resistivity, Mitsubishi Chemical Industries Four Probe Resistance Detector (Loresta-GP) was utilized.

EXAMPLES 1 TO 6

There were prepared polishing slurries, which contained 5 wt % of θ alumina (Sumitomo Chemical Industries; AKP-G008), 7 wt % of $H_2O_2$ (Kanto Chemical Co.) and 0.1–5 wt % of n-amylamine (Kanto Chemical Co.) and whose pH was adjusted to 7.0 with nitric acid. $H_2O_2$ was, herein, added immediately before performing CMP.

As Case 1 for Comparison, a polishing slurry was prepared in the same way as Examples 1–6, except that no n-amylamine was added thereto.

Using these polishing slurries, CMP tests were made. Their results are listed in Table 1. As seen clearly in Table 1, the addition of n-amylamine successfully reduced the polishing rate for a tantalum film. The step-meter analysis of the substrate state after polishing, together with the observation of the substrate cross-section by SEM (Scanning Electron Microscopy) confirmed that dishing and erosion were well suppressed.

The above results demonstrate that when any of the polishing slurries in Examples 1–6 is used for polishing a copper film, a tantalum layer thereunder functions well as a stopper film.

EXAMPLES 7 AND 8

Polishing slurries were prepared in the same way as Example 4 except that, in place of n-amylamine, n-butylamine (Tokyo Kasei Kogyo Co., Ltd.) (Example 7) or n-hexylamine (Tokyo Kasei Kogyo Co., Ltd.) (Example 8) were employed as a higher-mono-primary amine.

Further, as Case 2 for Comparison, a polishing slurry was prepared in the same way as Example 4 except that, in place of n-amylamine, n-propylamine (Tokyo Kasei Kogyo Co., Ltd.) was added thereto.

Using these polishing slurries, CMP tests were made. Their results are listed in Table 1. As seen clearly in Table 1, even when a mono-primary amine other than n-amylamine was used, the polishing rate for a tantalum film could be reduced. Particularly when n-butylamine or n-hexylamine was used, in comparison with the case that n-propylamine was used, the polishing rate was a great deal lowered. Further, the step-meter analysis of the substrate state after polishing, together with the observation of the substrate cross-section by SEM confirmed that dishing and erosion were well suppressed.

EXAMPLES 9 AND 10

Polishing slurries were prepared in the same way as Example 4 except that, in place of alkylamine, isopropoxy-n-propylamine (Tokyo Kasei Kogyo Co., Ltd.) (Example 9) or n-butoxy-n-propylamine (Tokyo Kasei Kogyo Co., Ltd.) (Example 10) were employed as an alkoxyalkylamine.

Using these polishing slurries, CMP tests were made. Their results are listed in Table 1. As seen clearly in Table 1, even when alkoxyalkylamine was used, the polishing rate for a tantalum film could be reduced. Further, the step-meter analysis of the substrate state after polishing, together with the observation of the substrate cross-section by SEM confirmed that dishing and erosion were well suppressed.

EXAMPLES 11–13

Polishing slurries were prepared in the same way as Example 4 except that glycine (Example 11), citric acid (Example 12) or malic acid (Example 13) was added thereto as an organic acid and the pH thereof was, if required, adjusted to 7.0 with KOH.

Using these polishing slurries, CMP tests were made. Their results are listed in Table 1. As seen clearly in Table 1, even when an organic acid was added, the addition of n-amylamine successfully reduced the polishing rate for a tantalum film. The step-meter analysis of the substrate state after polishing, together with the observation of the substrate cross-section by SEM confirmed that dishing and erosion were well suppressed.

EXAMPLE 14

A polishing slurry was prepared in the same way as Example 12 except that fumed silica (Tokuyama Corporation QS-9) was used as a polishing grain, instead of alumina.

As Case 3 for Comparison, a polishing slurry was prepared in the same way as Examples 14, except that no n-amylamine was added thereto.

Using these polishing slurries, CMP tests were made. Their results are listed in Table 1. As seen clearly in Table 1, even when silica was used as a polishing grain, an addition of n-amylamine successfully reduced the polishing rate for a tantalum film. The step-meter analysis of the substrate state after polishing, together with the observation of the substrate cross-section by SEM confirmed that dishing and erosion were well suppressed.

TABLE 1

|  | Polishing Grain (wt %) | Organic Acid (wt %) | Amine-based Compound (wt %) | Ta Polishing Rate (nm/min) |
|---|---|---|---|---|
| Example 1 | Alumina (8) | None | n-amylamine (0.1) | 7.56 |
| Example 2 | Alumina (8) | None | n-amylamine (0.25) | 3.45 |
| Example 3 | Alumina (8) | None | n-amylamine (0.5) | 1.68 |
| Example 4 | Alumina (8) | None | n-amylamine (1.0) | 1.13 |
| Example 5 | Alumina (8) | None | n-amylamine (2.0) | 0.64 |
| Example 6 | Alumina (8) | None | n-amylamine (5.0) | 0.27 |
| Example 7 | Alumina (8) | None | n-butylamine (1.0) | 1.54 |

TABLE 1-continued

|  | Polishing Grain (wt %) | Organic Acid (wt %) | Amine-based Compound (wt %) | Ta Polishing Rate (nm/min) |
|---|---|---|---|---|
| Example 8 | Alumina (8) | None | n-hexylamine (1.0) | 1.08 |
| Example 9 | Alumina (8) | None | Isopropoxy-n-propylamine (1.0) | 3.75 |
| Example 10 | Alumina (8) | None | n-butoxy-n-propylamine (1.0) | 2.87 |
| Example 11 | Alumina (8) | Glycine (1.0) | n-amylamine (1.0) | 0.98 |
| Example 12 | Alumina (8) | Citric acid (1.0) | n-amylamine (1.0) | 1.49 |
| Example 13 | Alumina (8) | Malic acid (1.0) | n-amylamine (1.0) | 1.35 |
| Example 14 | Silica (8) | Citric acid (1.0) | n-amylamine (1.0) | 0.44 |
| Case 1 for Comparison | Alumina (8) | None | None | 17.8 |
| Case 2 for Comparison | Alumina (8) | None | n-propylamine (1.0) | 3.09 |
| Case 3 for Comparison | Silica (8) | Citric acid (1.0) | None | 84.6 |

EXAMPLE 15

A polishing slurry was prepared in the same way as Example 3, except that 0.1 wt % of glycine and 0.01 wt % of benzotriazole were added thereto as an organic acid and an antioxidant, respectively.

As Case 4 for Comparison, a polishing slurry was prepared in the same way as Example 15 except that no n-amylamine was added thereto.

Using these polishing slurries, CMP tests were made. Their results are listed in Table 2. As seen clearly in Table 2, even when benzotriazole was added thereto, an addition of n-amylamine successfully reduced the polishing rate for a tantalum film. Furthermore, a ratio of the polishing rate of the copper film to that of the tantalum film was significantly improved. In other words, it was found that the addition of n-amylamine improved polishing selectivity for the copper film. The step-meter analysis of the substrate state after polishing, together with the observation of the substrate cross-section by SEM confirmed that dishing and erosion were well suppressed.

TABLE 2

|  | Polishing Grain (wt %) | Organic Acid (wt %) | Alkylamine (wt %) | Ta Polishing Rate (nm/min) | Cu Polishing Rate (nm/min) | Cu Polishing Rate/ Ta Polishing Rate |
|---|---|---|---|---|---|---|
| Example 15 | Alumina (8) | Glycine (1.0) | n-amylamine (0.5) | 1.74 | 617 | 354 |
| Case 4 for Comparison | Alumina (8) | Glycine (1.0) | None | 18.2 | 1254 | 68.9 |

What is claimed is:

1. A slurry for chemical mechanical polishing to polish a copper-based metal film formed on a tantalum-based metal film, which comprises a polishing grain, an oxidizing agent and a higher-mono-primary amine, wherein said higher-mono-primary-amine is an alkylamine or an alkoxyalkylamine of 4 to 6 carbon atoms.

2. A slurry for chemical mechanical polishing according to claim 1, wherein said higher-mono-primary amine is an alkylamine having the following general formula (1) in which x is a natural number that is not less than 4 but not greater than 6.

$$C_xH_{2x+1}-NH_2 \quad (1)$$

3. A slurry for chemical mechanical polishing to polish a copper-based metal film formed on a tantalum-based metal film, which comprises a polishing grain, an oxidizing agent and a higher-mono-primary amine, wherein said higher-mono-primary amine is an alkoxyalkylamine having the following general formula (2) in which m and n are, independently, natural numbers equal to or less than 6 and the sum of m and n is a natural number that is not less than 4 but not greater than 10.

$$C_mH_{2m+1}-O-C_nH_{2n}-NH_2 \quad (2)$$

4. A slurry for chemical mechanical polishing according to claim 1, which comprises, as said higher-mono-primary amine, at least one selected from the group consisting of butylamine, pentylamine, and hexylamine.

5. A slurry for chemical mechanical polishing according to claim 1, where the content of said higher-mono-primary amine is not less than 0.01 wt % but not greater than 5 wt % based on the total amount of the slurry for chemical mechanical polishing.

6. A slurry for chemical mechanical polishing according to claim 1, which further comprises an organic acid in an amount of not less than 0.01 wt % but not greater than 5 wt % based on the total amount of the slurry for chemical mechanical polishing.

7. A slurry for chemical mechanical polishing according to claim 1, the slurry has a pH of not less than 3 but not greater than 9.

8. A slurry for chemical mechanical polishing according to claim 7, where the content of said higher-mono-primary amine is not less than 0.01 wt % but not greater than 5 wt % based on the total amount of the slurry for chemical mechanical polishing.

9. A slurry for chemical mechanical polishing according to claim 8, which further comprises an organic acid in an amount of not less than 0.01 wt % but not greater than 5 wt % based on the total amount of the slurry for chemical mechanical polishing.

10. A slurry for chemical mechanical polishing according to claim 9, which comprises, as said higher-mono-primary amine, at least one selected from the group consisting of butylamine, pentylamine, and hexylamine.

11. A slurry for chemical mechanical polishing according to claim 3, where the content of said higher-mono-primary amine is not less than 0.01 wt % but not greater than 5 wt % based on the total amount of the slurry for chemical mechanical polishing.

12. A slurry for chemical mechanical polishing according to claim 3, which further comprises an organic acid in an amount of not less than 0.01 wt % but not greater than 5 wt % based on the total amount of the slurry for chemical mechanical polishing.

13. A slurry for chemical mechanical polishing according to claim 3, the slurry has a pH of not less than 3 but not greater than 9.

14. A slurry for chemical mechanical polishing according to claim 13, where the content of said higher-mono-primary amine is not less than 0.01 wt % but not greater than 5 wt % based on the total amount of the slurry for chemical mechanical polishing.

15. A slurry for chemical mechanical polishing according to claim 14, which further comprises an organic acid in an amount of not less than 0.01 wt % but not greater than 5 wt % based on the total amount of the slurry for chemical mechanical polishing.

16. A slurry for chemical mechanical polishing according to claim 15, which comprises, as said higher-mono-primary amine, at least one selected from the group consisting of propoxyethylamine, propoxypropylamine and butoxypropylamine.

17. A slurry for chemical mechanical polishing according to claim 3, which comprises, as said higher-mono-primary amine, at least one selected from the group consisting of propoxyethylamine, propoxypropylamine and butoxypropylamine.

* * * * *